US005970318A

United States Patent [19]

Choi et al.

[11] Patent Number: 5,970,318

[45] Date of Patent: Oct. 19, 1999

[54] FABRICATION METHOD OF AN ORGANIC ELECTROLUMINESCENT DEVICES

[75] Inventors: Kang Hoon Choi; Tae Hyung Zyung; Sang Don Jung; Lee Mi Do, all of Daejeon, Rep. of Korea

[73] Assignee: Electronics and Telecommunications Research Institute, Daejeon, Rep. of Korea

[21] Appl. No.: 09/079,478

[22] Filed: May 15, 1998

[30] Foreign Application Priority Data

May 15, 1997 [KR] Rep. of Korea ...................... 97-18816

[51] Int. Cl.[6] ............................. H01L 27/01; H01L 33/00

[52] U.S. Cl. ................................ 438/99; 257/40; 257/99; 438/69

[58] Field of Search .......................... 438/99, 69; 257/40, 257/99, 103

[56] References Cited

U.S. PATENT DOCUMENTS

| | | | |
|---|---|---|---|
| 5,349,205 | 9/1994 | Kobayashi et al. | 257/99 |
| 5,384,517 | 1/1995 | Uno | 315/169.3 |
| 5,640,067 | 6/1997 | Yamauchi et al. | 313/504 |
| 5,663,573 | 9/1997 | Epstein et al. | 257/99 |
| 5,705,826 | 1/1998 | Aratani et al. | 257/40 |
| 5,853,905 | 12/1998 | So et al. | 257/40 |
| 5,876,786 | 3/1999 | Zyung et al. | 427/64 |

*Primary Examiner*—Donald L. Monin, Jr.
*Assistant Examiner*—Anh Duy Mai
*Attorney, Agent, or Firm*—Jacobson, Price, Holman & Stern, PLLC

[57] ABSTRACT

A method for manufacturing an organic EL display including an organic EL elements and an organic field effect transistors being integrated on a same substrate is disclosed. A semitransparent electrode layer of the organic EL element and a gate electrode of the organic transistor are formed on a same transparent plastic substrate. An organic gate insulating layer is deposited on the gate electrode and an organic semiconductor layer is formed on the organic gate insulating layer. A source and drain electrodes is formed on the organic semiconductor layer. An organic EL layer is formed on the semitransparent electrode layer and a part of the drain electrode. The organic semiconductor layer can be made of a charge transfer complex or a thiophene derivative polymer. The resultant EL device is capable of mechanically bent, and then is readily adaptable for use in flexible displays.

7 Claims, 4 Drawing Sheets

FABRICATION METHOD OF AN ORGANIC ELECTROLUMINESCENT DEVICES

BACKGROUND OF THE INVENTION

1. Field of the Invention

The present invention relates to a method for making an organic electroluminescent (EL) device, more specifically, to a method for manufacturing an actively controllable organic EL display including an organic EL elements and an organic field effect transistors (FET) being integrated on a same substrate.

2. Description of the Related Art

In an organic EL display device, many of organic EL elements are arranged in matrix on a substrate. Each of the EL elements, namely a pixel (picture element), consists of a transparent electrode layer, an organic EL layer and an upper electrode layer. At least one transistor for controlling current applied to the EL element is electrically connected to this EL element.

However, the conventional EL display has an exceedingly large size and complexity in process, since the EL element and the transistor are discrete each other. Also, it is impossible to mechanically bend because an active region of the conventional transistor is composed of an inorganic substance.

SUMMARY OF THE INVENTION

It is therefore an object of the present invention to provide an improved method for manufacturing an actively controllable organic electroluminescent device which is capable of mechanically bent and is readily adaptable for use in flexible displays.

It is another object of the present invention to provide a method for manufacturing an organic electroluminescent device having a small size, and inexpensive and simple to manufacture.

A further object of the present invention is to provide a fabrication method of an organic electroluminescent device in which the EL elements (or pixel) is easily controlled and drivn by an organic FET on a same substate.

According to a preferred embodiment of this invention, there is provided a method for manufacturing an organic electroluminescent device including a plurality of organic electroluminesecnt (EL) elements and a plurality of organic field effect transistors to drive thereof comprising the steps of:

forming a semitransparent electrode layer of the organic EL element and a gate electrode of the organic transistor on a same transparent plastic substrate, being of the space-apart distance between adjacent electrodes;

depositing an organic gate insulating layer on the gate electrode of the organic transistor;

forming an organic semiconductor layer used as an active layer of the transistor on the organic gate insulating layer;

forming a source and drain electrodes on the organic semiconductor layer, wherein one terminal of the drain electrode is electrically connected to the semitransparent electrode layer of the organic EL element;

forming an organic electorluminescent layer on the semitransparent electrode layer of the EL element and a part of the drain electrode of the organic transistor; and forming an upper electrode on the organic electroluminescent layer.

Preferably, the organic semiconductor layer of the organic transistor is composed of charge transfer complex or thiophene polymer. And the charge transfer complex is also used a member selected from the group consisting of copper phthalocyanine, tetrametyltetraselennafulvalene, bis (tetra-n-butylammonium) palladium (II), tetrathiafulvalene, and 7,7,8,8-tetracyano-p-quinodimethane.

More preferably, the organic EL element and the organic transistor being integrated on the same substrate are coupled as a series.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF DESCRIPTION OF THE DRAWINGS

The accompanying drawings are only for the purpose of illustrating a preferred embodiment of the invention and are not to be construed as limiting the invention.

DESCRIPTION OF THE PREFERRED EMBODIMENTS

Figure 1:
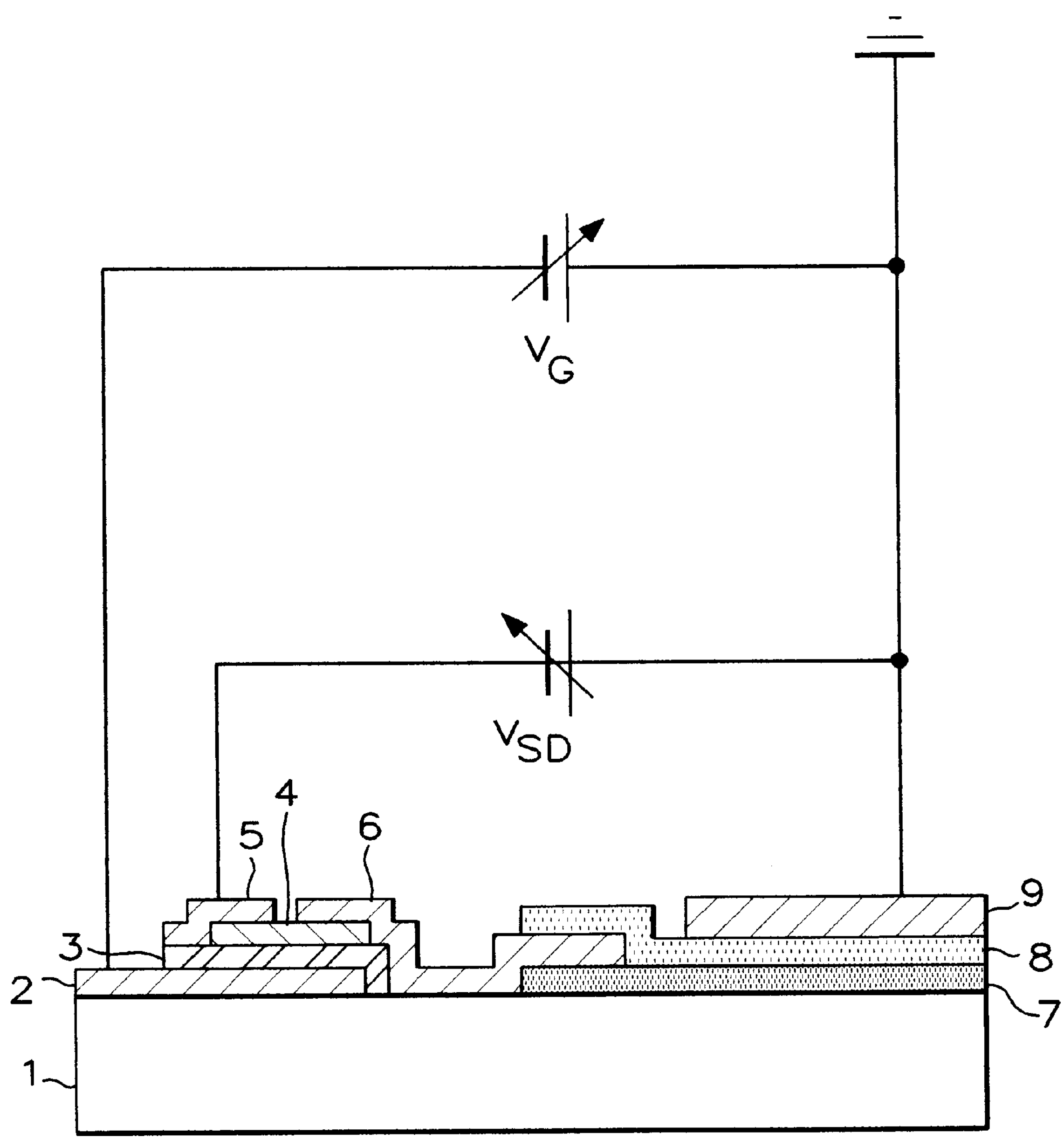
FIG. 1 is a cross-sectional view illustrating an organic EL device using an organic field effect transistor according to this invention.

FIG. 1 shows an organic EL element and an organic field effect transistor for controlling current applied to the EL element in a preferred embodiment of an organic EL device according to the present invention.

In FIG. 1, a reference numeral 1 denotes a transparent substrate such as plastic substrate. On the single substrate 1, many of the organic EL elements and their peripheral transistor such as current control and driving transistors are formed.

Each of the organic transistors is substantially constituted by a gate electrode 2 formed on the substrate 1, an organic gate dielectric layer 3 formed on the gate electrode 2, an organic semiconductor layer 4 used as an active layer of the transistor formed on the gate dielectric layer, and a source and drain electrodes 5 and 6 formed on the organic semiconductor layer 4.

Each of the EL elements is substantially constituted by a semitransparent electrode layer 7 such as indium-tin-oxide (ITO) formed on the substrate 1, an organic electroluminescent layer 8 formed on the electrode layer 7, and an upper electrode 9 formed on the organic EL layer 8.

As shown in FIG. 1, the EL element and the transistor are formed on the single transparent plastic substrate 1.

Referring to FIGS. 2*a* to 2*e,* manufacturing processes of the organic EL element and the organic field effect transistor of this embodiment will be described in detail.

Figure 2A:
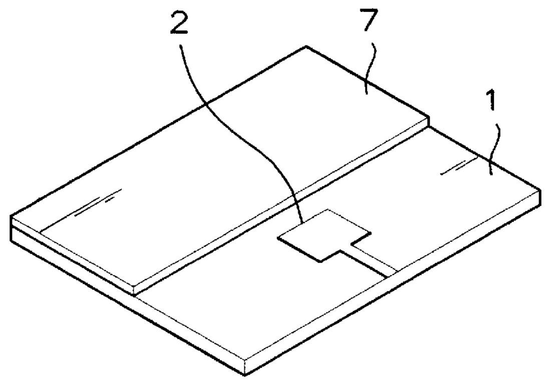
FIGS. 2*a*~2*e* are process perspective view sequentially showing a fabrication method of an organic EL device in accordance with this invention.

As shown in FIG. 2*a,* on a transparent substrate 1 such as a plastic substrate, a transparent conductive film of indium-tin-oxide (ITO) is sputtered to form a semitransparent electrode layer 7 in the organic EL element forming region, and then a gate electrode 2 is formed in the organic transistor forming region by depositing a gate metal. The gate electrode 2 can be made of Cr/Au or Ti/Au and the thickness of the gate electrode 2 is about 1000 Å.

Figure 2B:
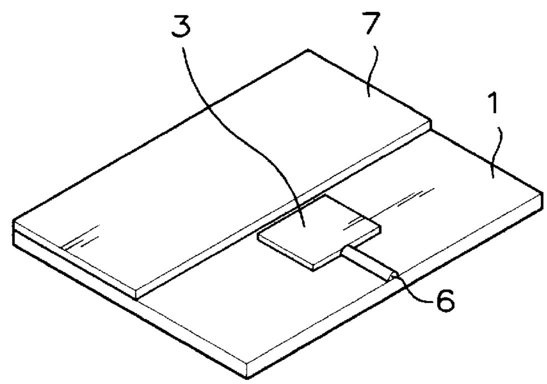

Referring to FIG. 2*b,* on the gate electrode 2 in the transistor region, a gate insulating layer 3 made of an organic substance is formed by a vacuum evaporation or a spin coating method with a thickness of 3 micrometers and a conductivity less than $10^{-14}$ S/cm.

Figure 2C:
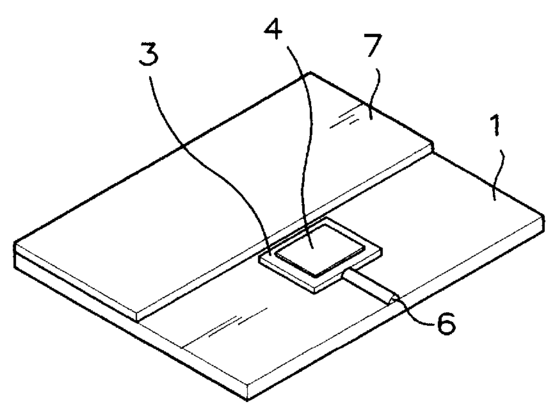

Referring to FIG. 2*c,* an organic semiconductor layer 4 used as an active layer of the transistor is deposited by spin coating or vacuum deposition method on the organic gate insulating layer 3. Preferably, the thickness of the organic semiconductor layer 4 is less than 100 nm.

At this time, the organic semiconductor layer 4 of the organic transistor can be made of a charge transfer complex or a thiophene polymer in order to enhance the mobility and the driving current of the field effect transistor. More preferable, the organic semiconductor layer 4 can be formed of multi-layer structure laminated with the charge transfer complex and the polymer material. The charge transfer complex is also used a member selected from the group consisting of copper phthalocyanine, tetrametyltetraselennafulvalene, bis (tetra-n-butylammonium) palladium (II), tetrathiafulvalene, and 7,7,8,8-tetracyano-p-quinodimethane.

Figure 2D:
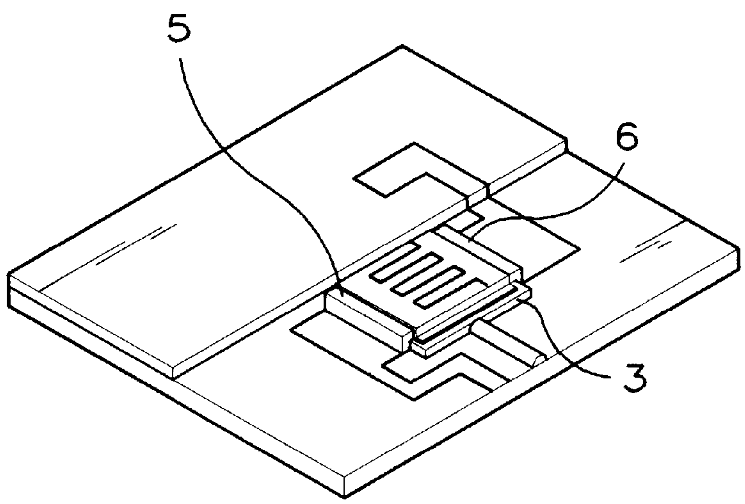

Then, as shown in FIG. 2*d,* a gold film with high electric conductivity is deposited and the deposited gold film is etched so as to form a source electrode 5 and a drain electrode 6. At this time, one terminal of the drain electrode 6 is electrically connected to the semitransparent electrode layer 7 of the organic EL element, and the distance between the source and drain electrodes 5 and 6, that is, the channel length is less than 10 micrometers.

Figure 2E:
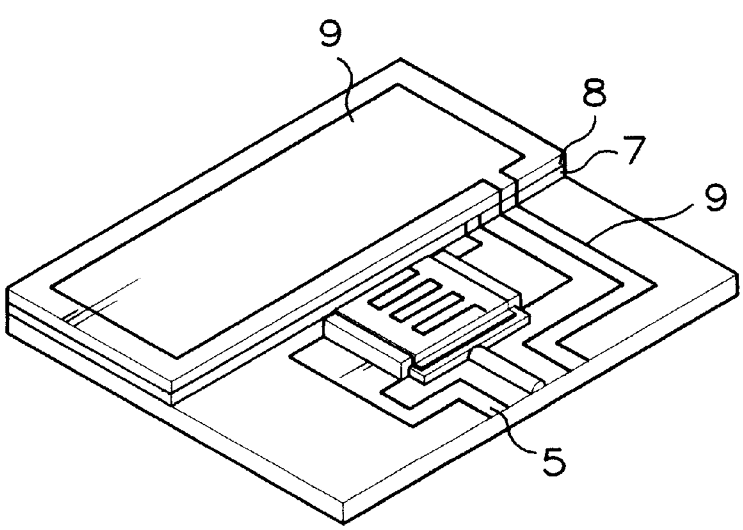

Then, as shown in FIG. 2*e,* an organic electorluminescent layer 8 is formed on the semitransparent electrode layer 7 of the EL element and a part of the drain electrode 6 of the organic transistor. Finally, a metal film is deposited by vacuum deposition method to form an upper electrode 9. At this time, the metal film of the upper electrode 9 is used Ca or Mg which its work function is less than that of the semitransparent electrode layer 7 (ITO).

Figure 3:
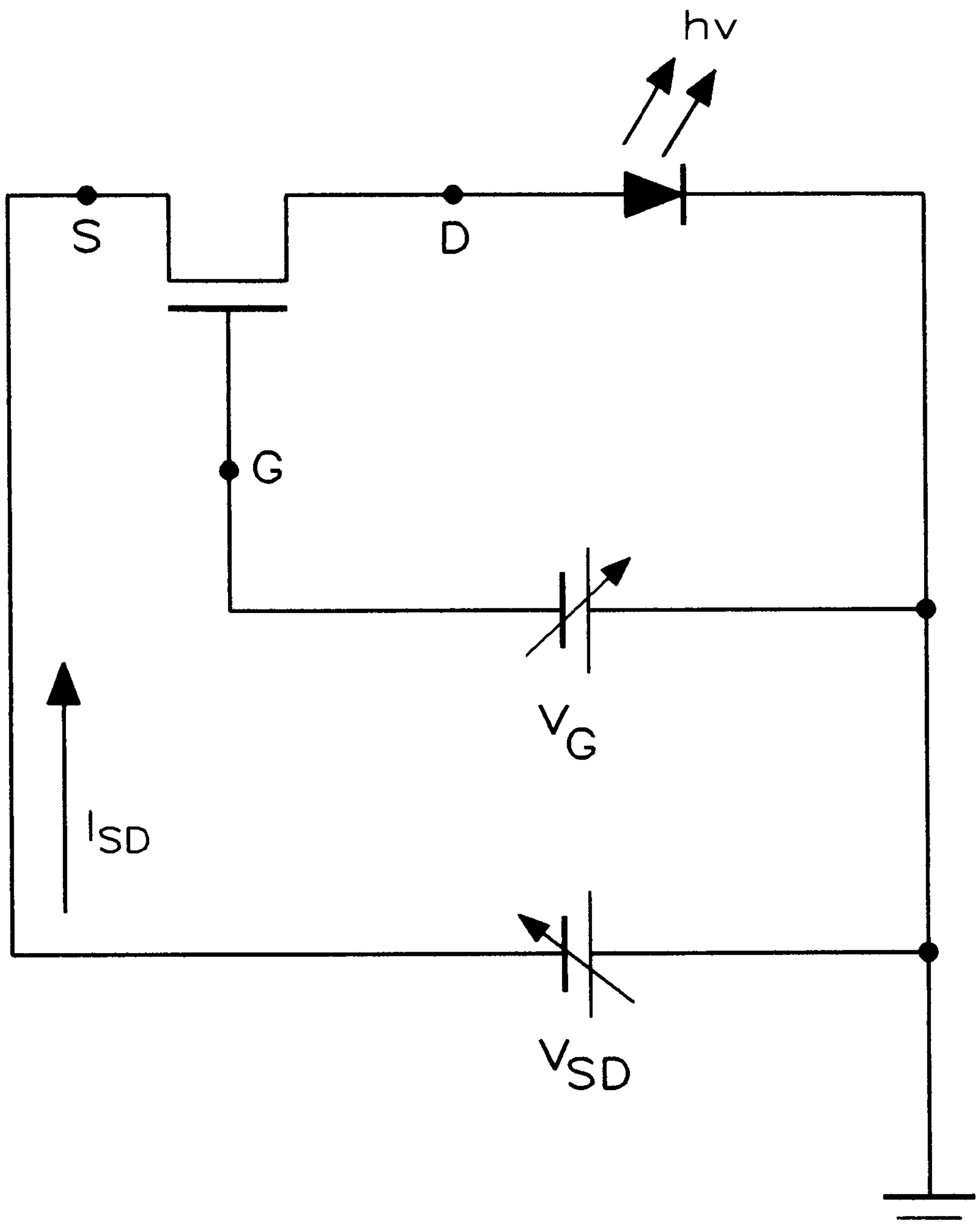
FIG. 3 is a circuit diagram showing an operation of an organic EL device according to this invention.

FIG. 3 is a circuit diagram showing an operation of an organic EL device according to this invention. As shown in FIG. 3, the organic semiconductor layer, that is, organic light emitting diode (OLED) is located between the gate electrode (G) and the drain electrode (D) of the transistor. In other words, the organic field effect transistor and the EL element are coupled as a series.

In the aforementioned embodiment, the operation is described that the voltage $V_{SD}$ applied between the source (S) and drain (D) is increased up to turn-on voltage ($V_{turn\text{-}on}$) which is applied to EL element, and then the current ($I_{SD}$) flows in the OLED. The $I_{SD}$ is controlled by the gate voltage ($V_G$).

In order to operate the organic EL device in accordance with present invention, the major parameter is resistivity of the OLED as shown in FIG. 3. That is, the organic EL device according to this invention can be operated in case of following condition.

$$R_{ON} < R_{EL} < R_{OFF},$$

where, $R_{EL}$ is resistivity of the organic EL layer (OLED), $R_{ON}$ is resistivity in on-state of the transistor, and $R_{OFF}$ is resistivity in off-state of the transistor.

According to the present invention, an organic electroluminescent device is capable of mechanically bent, and then is readily adaptable for use in flexible displays.

Also, it is advantage that an organic EL device according to this invention has small size, and inexpensive and simple to manufacture.

Furthermore, this invention is a basic of actively controllable EL pixels.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing an organic electroluminescent device including a plurality of organic electroluminescent (EL) elements and a plurality of organic field effect transistors to drive thereof comprising the steps of:
   - forming a semitransparent electrode layer of the organic EL element and a gate electrode of the organic transistor on a same transparent plastic substrate, being of the space-apart distance between said adjacent electrodes;
   - depositing an organic gate insulating layer on the gate electrode of the organic transistor;
   - forming an organic semiconductor layer used as an active layer of the transistor on the organic gate insulating layer;
   - forming a source and drain electrodes on the organic semiconductor layer, wherein one terminal of the drain electrode is electrically connected to the semitransparent electrode layer of the organic EL element;
   - forming an organic electroluminescent layer on the semitransparent electrode layer of the EL element and a part of the drain electrode of the organic transistor; and
   - forming an upper electrode on the organic electroluminescent layer.

2. The method as claimed in claim 1, wherein said organic semiconductor layer of the organic transistor is composed of charge transfer complex.

3. The method as claimed in claim 2, wherein said charge transfer complex is used a member selected from the group consisting of copper phthalocyanine, tetrametyltetraselennafulvalene, bis (tetra-n-butylammonium) palladium (II), tetrathiafulvalene, and 7,7,8,8-tetracyano-p-quinodimethane.

4. The method as claimed in claim 1, wherein said organic semiconductor layer of the organic transistor is composed of thiophene derivative polymer.

5. The method as claimed in claim 1, wherein said organic semiconductor layer of the organic transistor has multi-layer structure laminated with a charge transfer complex and a polymer material.

6. The method as claimed in claim 1, wherein said organic EL element and said organic transistor being integrated on the same substrate are coupled as a series.

7. The method as claimed in claim 1, wherein said organic EL element is actively driven by said organic transistor (FET) being integrated on the same substrate.

* * * * *